United States Patent

Inaba

[11] Patent Number: 6,137,732
[45] Date of Patent: Oct. 24, 2000

[54] SEMICONDUCTOR MEMORY DEVICE HAVING VOLTAGE BOOSTING CIRCUIT

[75] Inventor: Hideo Inaba, Kanagawa, Japan

[73] Assignee: NEC Corporation, Tokyo, Japan

[21] Appl. No.: 09/313,078

[22] Filed: May 17, 1999

[30] Foreign Application Priority Data

May 20, 1998 [JP] Japan .................................. 10-138757

[51] Int. Cl.⁷ ................................................ G11C 16/04
[52] U.S. Cl. ............................. 365/189.09; 365/230.06
[58] Field of Search ....................... 365/189.09, 189.05, 365/189.11, 185.19, 230.06, 236, 226; 331/57

[56] References Cited

U.S. PATENT DOCUMENTS

| | | | |
|---|---|---|---|
| 5,446,418 | 8/1995 | Hara et al. | 331/57 |
| 5,774,397 | 6/1998 | Endoh et al. | 365/185.19 |
| 5,838,613 | 3/1999 | Takizawa | 365/185.04 |
| 5,881,000 | 3/1999 | Maeda | 365/189.09 |

FOREIGN PATENT DOCUMENTS

| | | |
|---|---|---|
| 3-273594 | 12/1991 | Japan . |
| 4-212788 | 8/1992 | Japan . |
| 5-120882 | 5/1993 | Japan . |
| 5-313795 | 11/1993 | Japan . |
| 5-325578 | 12/1993 | Japan . |
| 8-287677 | 11/1996 | Japan . |

Primary Examiner—David Nelms
Assistant Examiner—David Lam
Attorney, Agent, or Firm—Sughrue, Mion, Zinn, Macpeak & Seas, PLLC

[57] ABSTRACT

A semiconductor memory device has a ring oscillator that is configured so that its period in the time before reaching a raised voltage is made short and further so that its period after reaching the raised voltage is made long, and a voltage boosting circuit that raises the voltage on a word line of memory cells, based on a boosted potential that is output from the ring oscillator. The ring oscillator performs a plurality of voltage boosting operations until the boosted potential of the word line of the memory cells reaches the voltage that is required for writing of data thereinto, and makes the period of the ring oscillator output ROC short while performing the plurality of boosting operations, and makes the period of the ring oscillator output ROC long after a prescribed raised voltage level is reached, thereby reducing the amount of AC current that flows in the ring oscillator itself.

12 Claims, 8 Drawing Sheets

Fig. 9
PRIOR ART
(a)
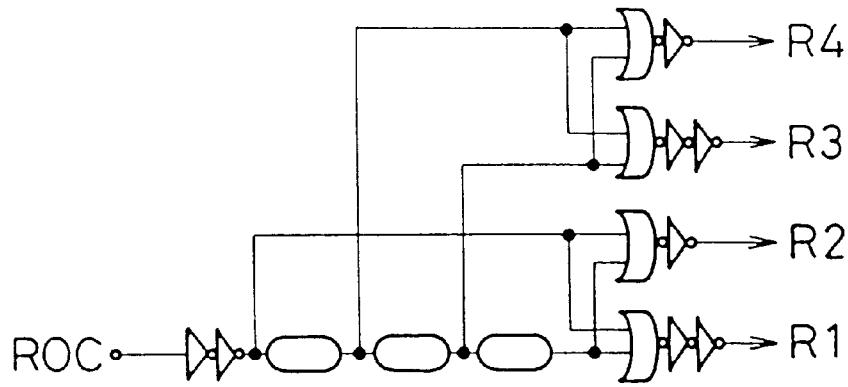
(b)
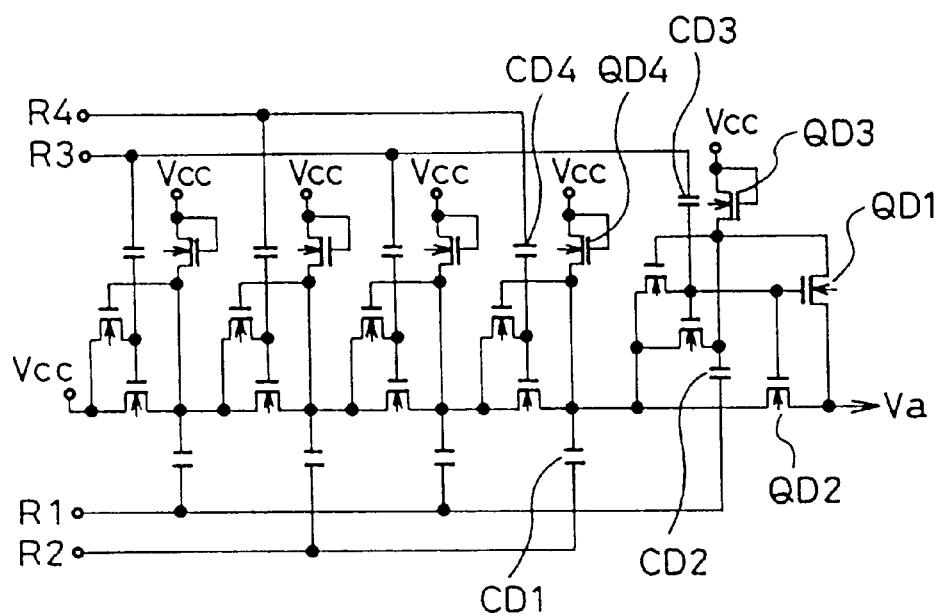

(a)　　　　　(b)

(a)　　　　　(b)

SEMICONDUCTOR MEMORY DEVICE HAVING VOLTAGE BOOSTING CIRCUIT

BACKGROUND OF THE INVENTION

1. Field of the Invention

The present invention relates to a static semiconductor memory device (SRAM), and more particularly to voltage boosting circuit used for the memory device for the purpose of lowering the power supply voltage.

2. Description of the Related Art

In recent years, with an increase in usage of portable equipment of semiconductor device, advancements have been made in compactness and power savings.

For this reason, a voltage boosting circuit has been used in semiconductor devices for the purpose of enabling battery-powered operation.

In the Japanese Unexamined Patent Publication (KOKAI) No. 3-273594, there is a disclosure of technology for a semiconductor device that has a voltage boosting circuit that enables low-voltage operation by raising the voltage within the semiconductor device to higher than the externally applied power supply voltage.

The technology that is disclosed in the Japanese Unexamined Patent Publication (KOKAI)No. 3-273594 is directed to a dynamic semiconductor memory device (DRAM), and in this technology, as shown in FIG. 7, to be described later, the semiconductor memory has a voltage boosting circuit that makes use of a charge pump, so as to improve low-voltage data amplification and memory cell writing, and the like.

In the Japanese Unexamined Patent Publication (KOKAI) No. 4-212788, there is a disclosure of technology for using the voltage boosting circuit that is shown in FIG. 7 in a four-transistor static semiconductor memory (SRAM) device, whereby an SRAM is implemented which, while maintaining a high level of integration, is capable of low-voltage reading and writing, in which the word line is stepwise increased in voltage only at the time of writing of data into the memory cell.

Additionally, in the Japanese Unexamined Patent Publication (KOKAI)No. 5-120882, there is a disclosure of a SRAM with TFT memory cells that is capable of raising the voltage during a wait time, using a small electrical power.

The reason why it is necessary to boost the word line voltage using a voltage boosting circuit in an SRAM that operates at low voltage is as follows.

FIG. 11 shows circuit that is a combination of a four-transistor memory cell 17, which uses the four transistors Qa, Qb, Qc, and Qd, and a pre-charge circuit 16, which uses the three transistors Qe, Qf, and Qg.

In FIG. 11, the reference numeral wL denotes a word line, the n-type transistors Qa and Qc functioning as memory cell transfer gates, and the n-type transistors Qb and Qd functioning as memory cell drivers. The resistive elements R1 and R2 are load resistances, D and DB are bit lines, and the two transistors Qe and Qf are pre-charge transistors.

FIG. 12 and FIG. 13 will be used to described the difference between having or not having a boosted potential when data writing is done in a memory cell such as shown in FIG. 11.

FIG. 12(a) shows the case in which a data write operation is performed without raising the voltage on the word line, and FIG. 13(a) shows the case in which a data write operation is performed with the voltage on the word line raised. FIG. 12(b) and FIG. 13(b) show the cases in which after the data write operation was performed under the conditions as shown in FIG. 12(a) and FIG. 13(a), the data reading operation was performed, respectively, without putting an intervening wait time, following the data write operation having been completed.

In the drawings, in the data before the write operation, the node V2 is at the power supply voltage VCC and the voltage at the node V1 is at ground, with the bit lines D and DB being supplied by voltage from the pre-charge transistors Qe and Qf, so that their voltages are at the VCC level.

First, the case in which data is to be written so as to cause a reversal of the potentials on the nodes V1 and V2 of the memory cell 17 will be described.

In this case, the level on the word line WL1, which is the selection line of the memory cell 17 is caused to change to the high level, and the level on the bit line DB is caused to be low, so that data is written into the memory cell 17.

When this is done, the node V2 is at the ground level, the same as the bit line DB, while the node V1, because of the threshold voltage of the cell transfer gate, cannot be boosted up to the power supply voltage VCC, and is brought to close to the power supply voltage VCC by just the current that is supplied through the load resistance R1.

Then, in the case in which data is read from the memory cell 17, the transistors Qe, Qf, and Qg of the pre-charge circuit 16 are switched on simultaneously in order to reset the data of another memory cell 17, so that the potential on the bit lines D and DB is pre-charged and rises to the power supply voltage VCC.

Next, in the case in which, after data writing, data which was written into a memory cell is to be read out immediately, as shown in FIG. 12(b), the level on the word line WL1, similar to the case of data writing, is changed to the high level, but because the reading of data is done without raising the node V1 to the power supply voltage VCC, the data that was written with the gate-source voltage of the transistor Qd as a memory cell driver being low is read out.

For this reason, there is a drop in the current capacity in comparison to the case in which the gate voltage of the transistor Qd is at the power supply voltage VCC, and the electrical charge that flows from the transfer gate Qc of the bit line DB causes the potential at the node V2 to rise.

In response to this rise in potential, the potential at the node V1 drops, so that there is only a very small difference in potential between the nodes V1 and V2. This impairs the holding of data in the memory cell at a low voltage.

To solve the above-noted problem, as shown in FIG. 13(a), the level on the word line is raised to the raised potential VBB, thereby raising it to above the threshold voltage of the transfer gate Qa, the result being that level on the node V1 at the time of writing is raised to the power supply voltage VCC.

By doing this, as shown in FIG. 13(b), even if data is read immediately after it is written, because of the large difference in potentials between the nodes V1 and V2, the cell data is not destroyed, even at a low voltage.

The configuration of the voltage boosting circuits all make use of the charge on a capacitor, a capacitor being charged up so as to produce a voltage that is greater than the externally applied power supply voltage, the raised potential Va being a function of the external power supply voltage VCC as shown below.

$$Va=(Ca/(Cx+Ca))\times VCC+VCC \quad \text{(Equation 1)}$$

In the above, Ca is the boot capacitance internal to the voltage boosting circuit, and Cx is the load capacitance that is to be raised to the raised potential.

As can be seen from Equation 1, in order to make the raised potential high, it is necessary to make the boot capacitance Ca higher than the load capacitance Cx. However, in order to make the chip size small and reduce the cost, it is difficult to make this boot capacitance Ca large.

For this reason, the three above-described prior art examples use a ring oscillator and a configuration in which the voltage is raised in steps.

The voltage boosting circuit that is shown in FIG. 7 is formed by the combination of a ring oscillator that is implemented by a NAND circuit B1 and the inverters B2 through B6, and a charge pump circuit 2, which is implemented by transistors QB1 and QB2 and a charge-amplifier capacitor CB1. The operation of the voltage boosting circuit shown in FIG. 7 will be described using FIG. 10.

In the voltage boosting circuit that is shown in FIG. 7, after the write start signal WCE changes to the high level, the ring oscillator 1 starts to operate, the output signal ROC from the ring oscillator 1 oscillating with an oscillation period that is established by the delays of the NAND circuit B1 and the inverters B2 through B5.

Before oscillation, the node Vb, which is one electrode side of the capacitor CB1 of the charge pump circuit 2 is stable at a potential that is established by the threshold voltage of the transistor QB1. When the oscillation signal ROC is input, the node Vb is raised to a potential difference that is the same as the supply voltage VCC.

By doing the above, the transistor QB2 goes into the on state, and the output voltage Va from the voltage boosting circuit also rises.

However, as indicated by Equation 1, if the output load on the output voltage Va from the voltage boosting circuit is large, it is not possible for the voltage to rise all at once to the raised potential VBB, the voltage Va rather being raised by a number of oscillation signal ROCs so that it reaches the boosted potential VBB.

The oscillation period that is required for the above operation can be determined by applying Equation 1. For example, for a boot capacitance Ca of 50 pF and a load capacitance Cx of 100 pF, if the power supply voltage VCC is 2 V and the transistor QB1 and QB2 threshold voltages are 0.5 V, the required raised voltage VBB would be 2.8 V.

First, the potential to which the voltage is raised at the first voltage boosting operation is as follows.

$$Va=(50/(100+50) \times 2+(2-0.5)=2.17 \text{ V} \qquad \text{Equation (2)}$$

Next, the potential to which the voltage is raised by the second voltage boosting is as follows.

$$Va=(50/(100+50) \times 2+2.17=2.83 \text{ V} \qquad \text{Equation (3)}.$$

Thus, as shown in FIG. 10, the required raised voltage VBB is obtained by two voltage boosting operations.

In general, a ring oscillator is formed by an odd number of inverters, and the operating speed of the ring oscillator is lower the lower the voltage is made.

For this reason, the period of the ring oscillator becomes large, so that the time required for voltage to be boosted to the desired raised voltage is delayed as the voltage is reduced and this delay representing a slowing of the speed of writing data.

Because of the above-noted phenomenon, there was a disclosure in the Japanese Unexamined Patent Publication (KOKAI)No. 5-325578 of technology, as shown in FIG. 8, for increasing up the period of the ring oscillator as the voltage becomes lower, as a solution for the problem of slowed-down writing.

In the technology that is shown in FIG. 8, a fixed-voltage potential Vref, which is not dependent upon the power supply potential, is used, the gate potentials of depression-type n-channel transistors T1 through T5 being given a dependency that is the opposite to the external power supply potential VCC (that is, so that when the external power supply potential VCC becomes lower, the gate potentials of transistors T1 through T5 become higher), and the fact that the on-resistances of the transistors T1 through T5 drops with a drop in the power supply potential being used, so that period of the ring oscillator is shortened, the lower the voltage is.

The p-channel transistor QC2, which has the fixed-voltage potential Vref as its source input has a current capacity that is not dependent upon the power supply potential. H However, the n-channel transistor QC1, which has the power supply voltage as an input to its gate exhibits a drop in current capacity accompanying a drop in power supply potential, the result being that the node C1 rises with a fall in the power supply potential.

Because of the above, the on resistances of the transistors T1 through T5 are made small, making it possible to speed up the period of the ring oscillator.

FIG. 9(a) and FIG. 9(b) show a voltage boosting circuit that is disclosed in the Japanese Unexamined Patent Publication (KOKAI)No. 5-325578, the method raising the voltage being therein basically the same as described above.

In FIG. 9, the capacitors CD1 and CD2, which are connected to the R1 and R2 inputs are voltage boosting capacitors, these corresponding to the capacitorCB1 shown in FIG. 7, the transistors QD3 and QD4 in FIG. 9 are for the purpose of holding the initial potential, these corresponding to the transistor QB1 shown in FIG. 7, and the transistors QD1 and QD2 of FIG. 9 are raised potential output gates, these corresponding to the transistor QB2 in FIG. 7.

A feature of the voltage boosting circuit that is shown in FIG. 9 is the use of separate capacitors CD3 and CD4 to raise the potentials of the boosted potential output gates by two voltage boosting operations over one period using the capacitors CD1 and CD2.

In the cases of FIG. 7 and FIG. 9, in an SRAM, in which it is not possible to make the capacitor size for the purpose of boosting the voltage large, it is necessary to use a plurality of voltage-boosting steps.

While the general purpose low-voltage operation is to enable battery-powered operation of SRAMs, limiting the AC current flowing in the ring oscillator is a condition for achieving a long battery-powered operating time.

In the above-described prior art, there is a means that operates faster the lower the voltage is, this being effective for high-speed, low-voltage operation of a SRAM.

In the case of repeated data writing operations under a lower voltage, however, the power consumption becomes large, leading to the problem that it is not possible to guarantee long periods of operation under battery power.

In the Japanese Unexamined Patent Publication (KOKAI) No. 8-287677, the technology disclosed is directed to a DRAM, and the technology disclosed in the Japanese Unexamined Patent Publication (KOKAI)No. 8-287677 is that of a configuration in which the voltage boosting circuit is caused to operate during the wait time of the DRAM.

However, with the technology that is disclosed in the Japanese Unexamined Patent Publication (KOKAI)No. 8-287677, the frequency is changed regardless of whether the DRAM is waiting or operating, and if this technology is applied to an SRAM, the current consumption will become large, leading to the problem of not being able to guarantee long periods of operation under battery power.

Additionally, in the case in which the voltage boosting circuit is to operate a large number of times before the raised potential is reached, because it is necessary to provide a plurality of voltage boosting circuit stages, there is the problem of not being able to achieve a circuit placement that fits in a compact surface area.

On the other hand, the Japanese Unexamined Patent Publication (KOKAI)No. 5-313795 discloses a semiconductor integrated circuit which can reduce an amount of consumption current during a standby period.

And in that, a charge pump can be selectively driven by a selection circuit which can selectively supply low frequency oscillating signal generated by an external oscillator or high frequency oscillating signal generated by an internal oscillator in response to a HALT signal.

Accordingly, it is an object of the present invention to provide a semiconductor memory device which can be driven under a low voltage and in which control is performed utilizing an internal command signal so that the period of a ring oscillator is shortened during the period required to reach the raised potential so as to speed up operation, and further so that after the completion of the raising of the voltage, the ring oscillator period is lengthened, thereby achieving a reduction in power consumption.

SUMMARY OF THE INVENTION

In order to achieve the above-noted object, the present invention adopts the following basic technical constitution.

Specifically, a semiconductor memory device according to the present invention is a static semiconductor memory device comprising memory cells, word lines each being connected to the memory cells and a word line boosting circuit including a ring oscillator therein and which is connected to the word line, the static semiconductor memory device being driven with a low voltage, wherein the ring oscillator of the boosting circuit is so configured that it is enabled to be switched in either one of high frequency driven mode and in low frequency driven mode, in response to an internal command signal.

In the present invention, the static semiconductor memory device is further configured so that in boosting a voltage of the word line, an output frequency of the ring oscillator is set out at shortened period until the voltage of the word line is boosted upto a predetermined voltage level and after that when the voltage of the word line had reached upto the predetermined voltage level, the output frequency of the ring oscillator is setout at lengthened periods.

The static semiconductor memory device of the present invention may further comprise the ring oscillator circuit generates a raised potential, while the a boosting circuit boosts the voltage of the word line of the memory cell, based on a boosted potential that is output from the ring oscillator.

Another aspect of the present invention is a semiconductor memory device which is driven with a low voltage, comprising a memory cell, a row decoder, a column decoder, a bit line control circuit, a voltage boosting circuit, and a ring oscillator circuit, wherein the memory cell is caused to store data, the row decoder selects a word line of the memory cell from an address buffer input, the column decoder selects a bit line of the memory cell, the bit line control circuit performs writing of data to and reading of data from the memory cell, and the voltage boosting circuit causes the potential of the word line of the memory cell to rise, and further wherein the ring oscillator circuit generates a boosted potential for the purpose of raising the potential of the memory cell word line, the ring oscillator operating with a shortened period until reaching the raised voltage and operating with a lengthened period after reaching the raised voltage, in response to a command signal out put from an internal signal generating means.

In the above-noted semiconductor memory device, the ring oscillator is caused to generate the raised potential, the period of this oscillator being made short during the time before reaching the raised potential, and being lengthened after reaching the raised potential.

The above-noted voltage boosting circuit raises the voltage on a word line of the memory cells, based on the raised potential that is output from the ring oscillator.

The above-noted ring oscillator has a counter and a transfer gate circuit, the counter monitoring the period of the ring oscillator, and the transfer gate circuit changing the period of the ring oscillator.

The above-noted transfer gate circuit counts the number of periods that are determined by an inverter and a NAND gate, and switches the period of the ring oscillator.

Instead of the above-noted counter, there can be a raised voltage level detection circuit can be provided, this raised voltage level detection circuit performing a count of the number of periods, which are established by an inverter and a NAND gate.

The above-noted ring oscillator raises the voltage a plurality of times until the word line raised voltage reaches a level that is required for memory cell writing, the ring oscillator period being made faster for this plurality of voltage-raising operations so as to quickly raise the word line potential and then, after reaching this potential, the oscillator output period is made slower.

BRIEF DESCRIPTION OF THE DRAWINGS

FIGS. 9($a$) and 9($b$) is a block diagram that shows a voltage boosting circuit according to the prior art.

DESCRIPTION OF THE PREFERRED EMBODIMENTS

Embodiments a semiconductor memory device according to the present invention are described below in detail, with references being made to relevant accompanying drawings.

Figure 1:
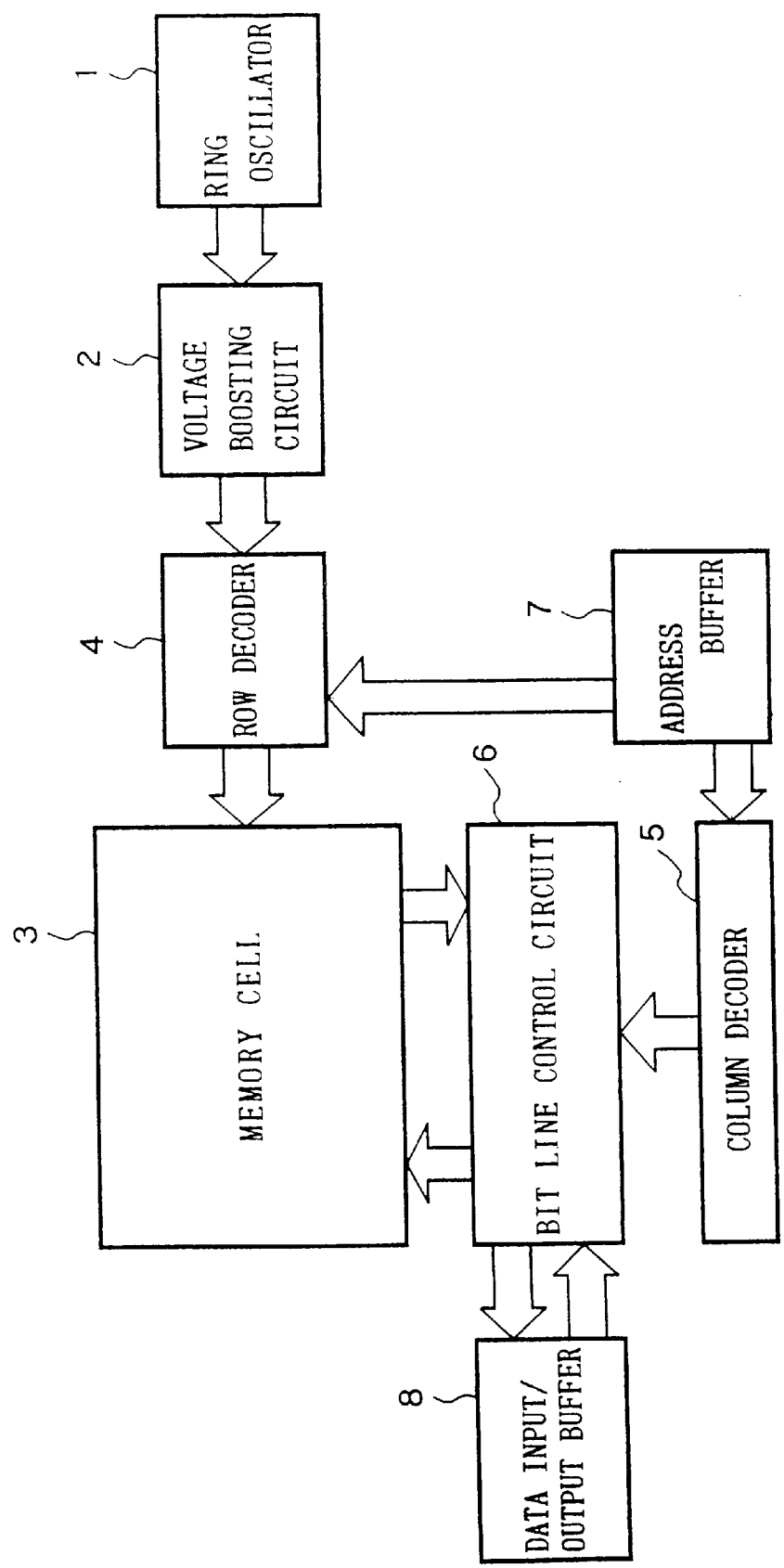
FIG. 1 is a block diagram that shows a semiconductor memory device according the first embodiment of the present invention.

FIG. 1 is a block diagram that shows the first embodiment of a semiconductor memory device according to the present invention, this being a static semiconductor memory device having a ring oscillator 1 and a voltage boosting circuit 2, and using memory cells 3.

The ring oscillator 1 generates the raised potential, and operates with a shortened period during the time before reaching the raised voltage and a lengthened period after reaching this raised voltage.

The voltage boosting circuit 2 is configured so as to raise the voltage on the word line of the memory cells 3, based on the raised potential that is output from the ring oscillator 1.

The ring oscillator 1 performs voltage boosting operations a plurality of times until the raised potential of the word line of the memory cells reaches a predetermined boosted voltage level that is sufficient for writing of data into the memory cells, and in the period during the plurality of voltage boosting operations, the period of the ring oscillator output ROC is made fast, so as to achieve the rise in the potential of the word line quickly.

Then, after the boosted voltage level VBB is reached, the period of the ring oscillator output ROC is made slow, so that the AC current flowing in the ring oscillator 1 itself is reduced.

Therefore, according to a semiconductor memory device of the present invention, the data writing speed thereof can be improved even though the device is driven with a low voltage level, and further by reducing the AC current that flows in the ring oscillator 1, the power consumption is reduced, making it possible to operate the semiconductor memory device over a long period of time at a low voltage.

Additionally, according to a semiconductor memory device of the present invention, there is a plurality of voltage boosting operations that are performed until reaching the raised potential VBB.

Figure 8:
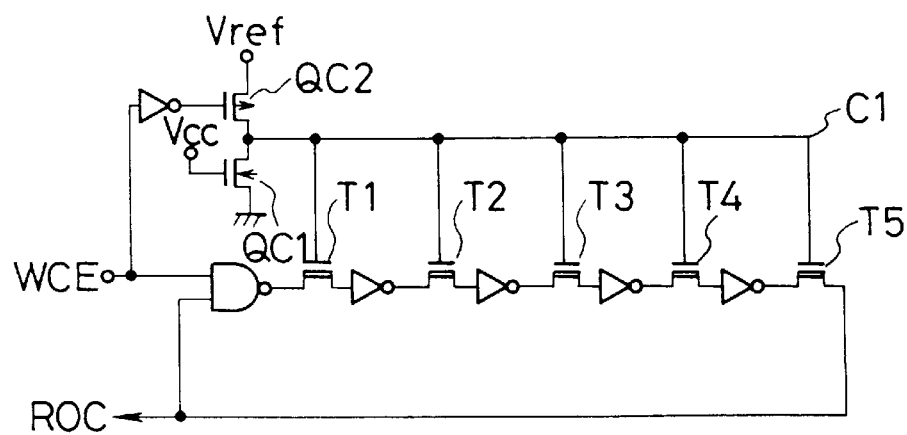
FIG. 8 is a block diagram that shows a ring oscillator according to the prior art.
Figure 10:
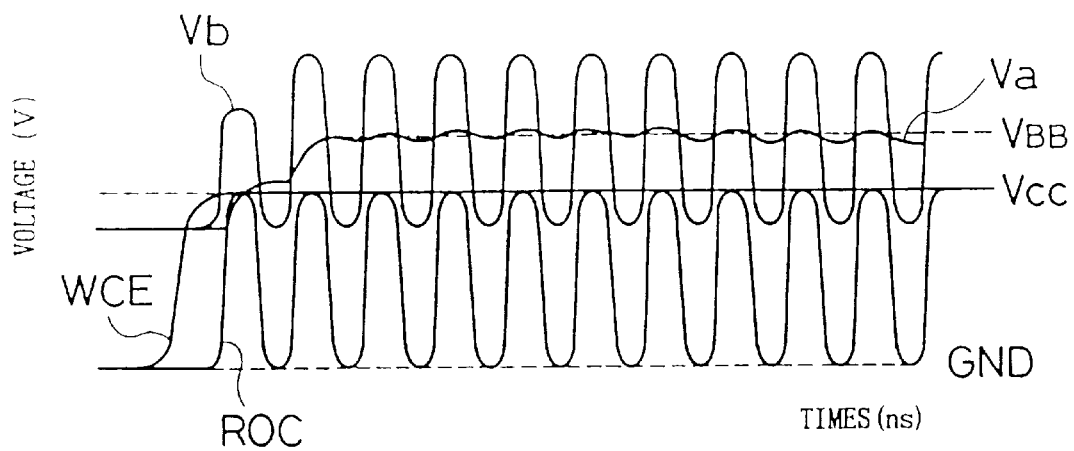
FIG. 10 is a timing diagram that illustrates the operation of the prior art.

However, because it is not necessary to provide a plurality of voltage boosting circuits, as shown in FIG. 8 and done in the prior art, it is possible to maintain a small surface area of the circuit.

Next, the first embodiment of a semiconductor memory device according to the present invention will be described in detail.

As shown in FIG. 1, the first embodiment of a semiconductor memory device according to the present invention has memory cells 3, a row decoder 4, a column decoder 5, a bit line control circuit 6, a voltage boosting circuit 2, and a ring oscillator 1.

Figure 11:
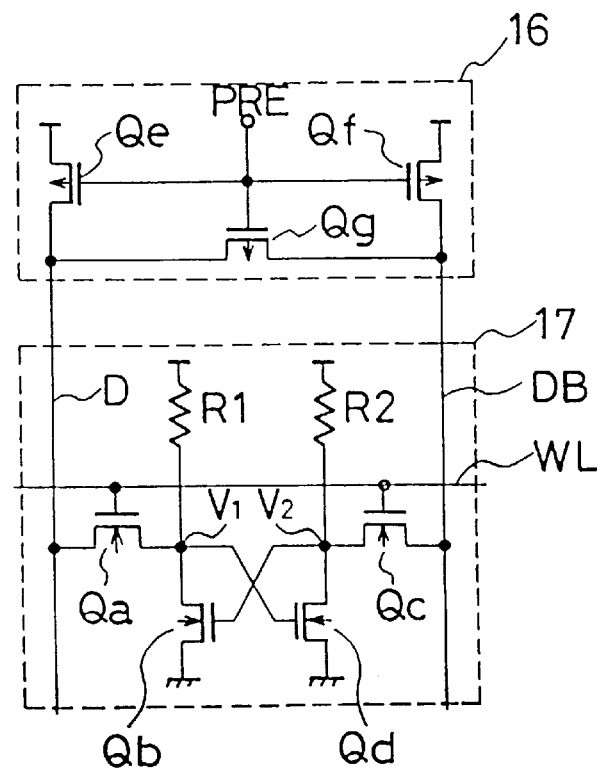
FIG. 11 is a block diagram that shows the memory cell peripheral circuitry for the purpose of illustrating the need for a voltage boosting circuit.
Figure 12:
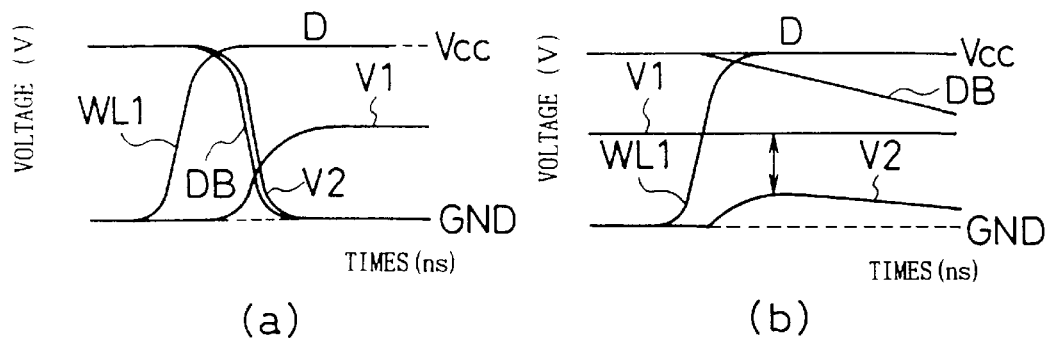
FIGS. 12(a) and 12(b) is a timing diagram for the case in which the voltage on the word line of FIG. 11 is not raised.
Figure 13:
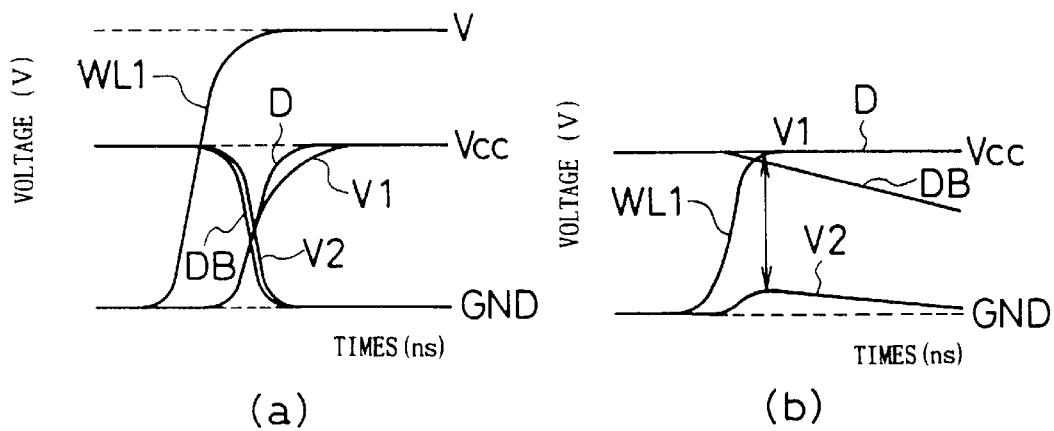
FIGS. 13(a) and 13(b) is a timing diagram for the case in which the voltage on the word line of FIG. 11 is raised.

The memory cells 3 are used to store data, and the row decoder 4 selects a word line of the memory cells 3, based on an input signal from the address buffer 7. The memory cells 3 are configured as four-transistor memory cells (refer to FIG. 11).

The column decoder 5 selects a bit line of the memory cells 3, and the bit line control circuit 6 performs data reading and writing to and from the memory cells 3, based on data transfer with the data input/output buffer 8.

The voltage boosting circuit 2 raises the potential of a word line of the memory cells 3, and the ring oscillator 1 is provided for the purpose of boosting the potential of the word line of memory cells 3 to a raised potential VBB.

The period of this ring oscillator is made short so as to shorten the data reading or writing operation during the time required to reach the raised potential VBB, and is made long after reaching that potential, so that the AC current flowing in the ring oscillator 1 itself is reduced.

Figure 2:
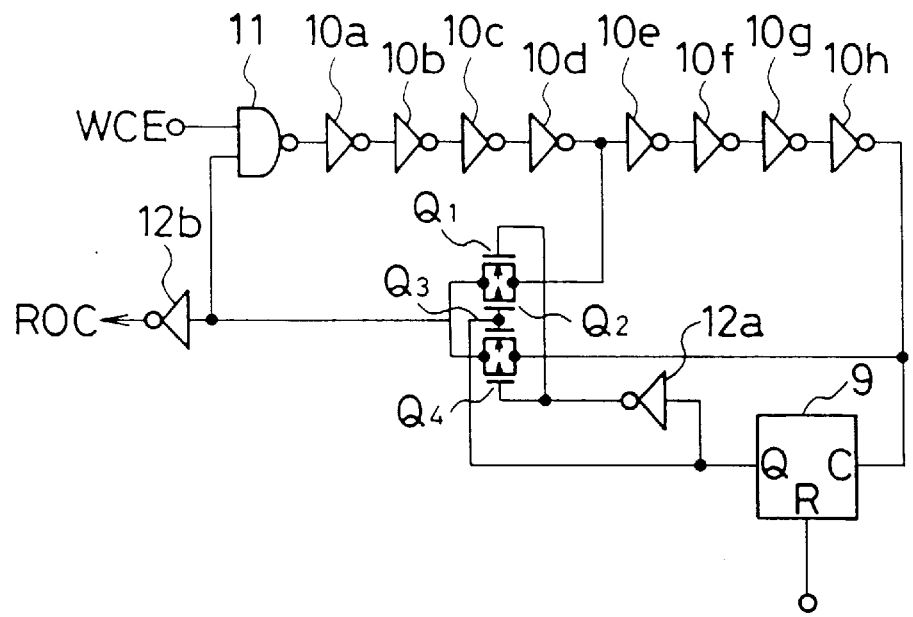
FIG. 2 is a block diagram that show a ring oscillator that is used in a semiconductor memory device according to the first embodiment of the present invention.

FIG. 2 shows a specific example of the ring oscillator 1. Specifically, as shown in FIG. 2, the ring oscillator 1 accepts the input of the memory cell write start signal WCE and outputs the periodic signal ROC, and is formed by the counter 9 and a transfer gate circuit.

The above-noted transfer gate circuit is formed by the eight inverters 10a, 10b, 10c, 10d, 10e, 10f, 10g, and 10h, a NAND circuit 11, n-channel transistors Q1 and Q3, and p-channel transistors Q2 and Q4.

The n-channel transistor Q1 and the p-channel transistor Q4 are configured to input the output of the counter 9, after it passes through an inverter 12a.

The signal from the transfer gate circuit is inverted by the inverter 12b and then output.

The above-noted transfer gate circuit is provided for the purpose of changing the period of the ring oscillator, the counter 9 counting the number of period and switching between the case in which the period is established by the combination of the four inverters 10a, 10b, 10c, and 10d and the NAND circuit 11, and the case in which the period is established by the combination of the eight inverters 10a, 10b, 10c, 10d, 10e, 10f, 10g, and 10f and the NAND circuit 11.

Figure 4:
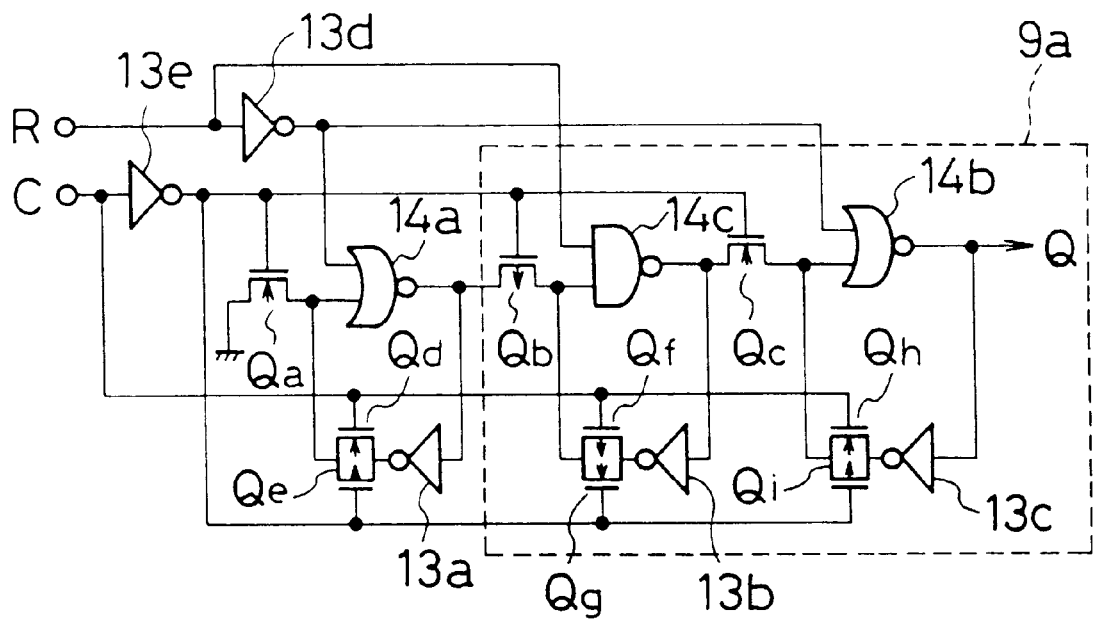
FIG. 4 is a block diagram that shows a counter that is used in a semiconductor memory device according to the first embodiment of the present invention.

The counter 9 monitors the ring oscillator period, and, as shown in FIG. 4, is formed by the five inverters 13a, 13b, 13c, 13d, and 13e, the two NOR circuits 14a and 14b, the single NAND circuit 14c, the p-channel transistors Qb, Qe, Qf, and Qi, and the n-channel transistors Qa, Qc, Qd, Qg, and Qh.

Next, the operation of the first embodiment of a semiconductor memory device according to the present invention will be described, with reference being made to FIG. 6(a).

The ring oscillator 1 that is used in the first embodiment of a semiconductor memory device according to the present invention, is configured so that, after the writing start signal WCE for writing of data into the memory cells 3 changes to the high level, it outputs the ring oscillator output signal ROC for the purpose of driving the voltage boosting circuit.

In the first embodiment, there are two voltage boosting operations provided until the word line of the memory cells 3 is raised to the required potential VBB for the writing of data into the cells.

During the period before completing these two voltage boosting operations, the period of the output ROC of the ring oscillator is made fast, so as to raise the potential of the word line quickly.

Then, after reaching the raised voltage level VBB, the period of the ring oscillator is made slow, so as to slow down the period of boosting the voltage.

First, in the case in which the write start signal WCE for writing data into the memory cells 3 is at the low level, the reset signal R of the counter 9, shown in FIG. 4, is input as a low level, at which time the output Q of the counter is at the low level.

Therefore, in the ring oscillator 1 as shown in FIG. 2, the transistors Q1 and Q2 of the transfer gate circuit go into the on state, the output ROC of the ring oscillator 1 changes to the low level.

Figure 6:
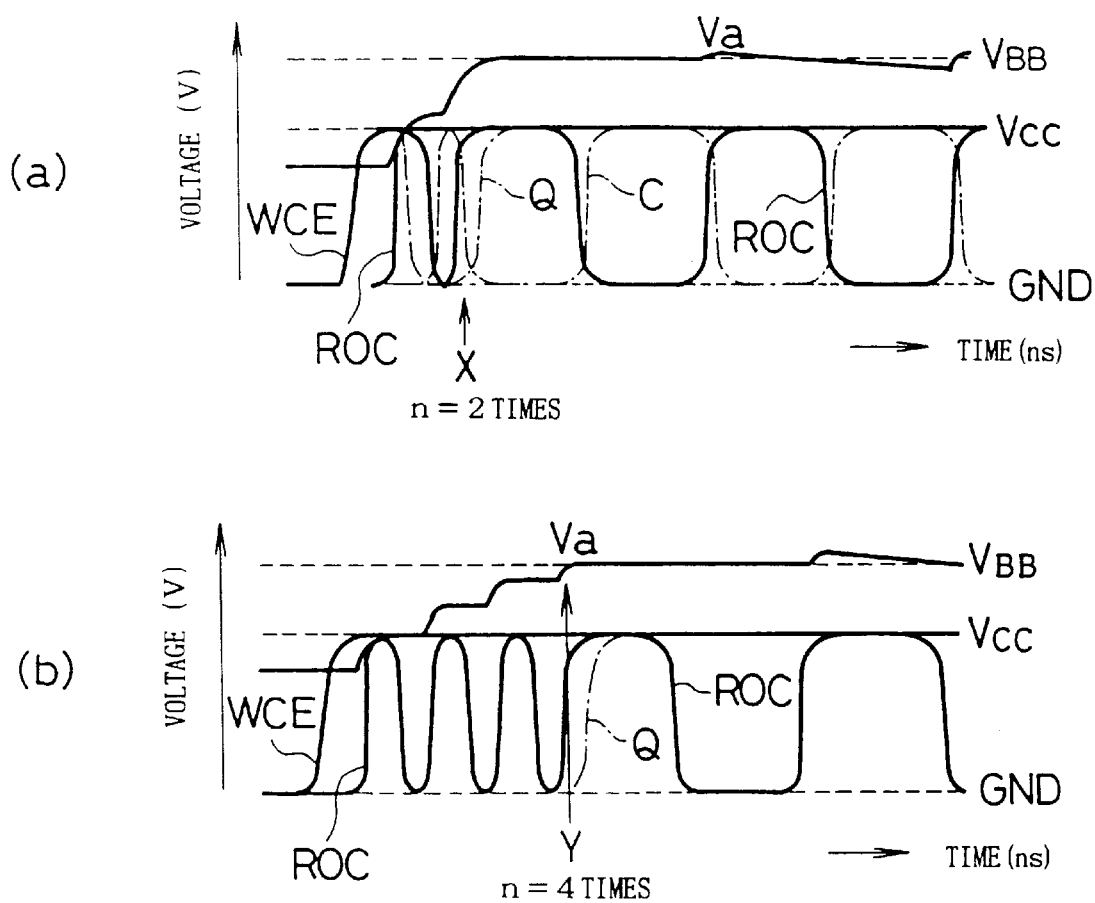
FIG. 6($a$) is a timing diagram that shows the operation of a semiconductor memory device according to the first embodiment of the present invention, and FIG. 6($b$) is a timing diagram that shows the operation of a semiconductor memory device according to the second embodiment of the present invention.
Figure 7:
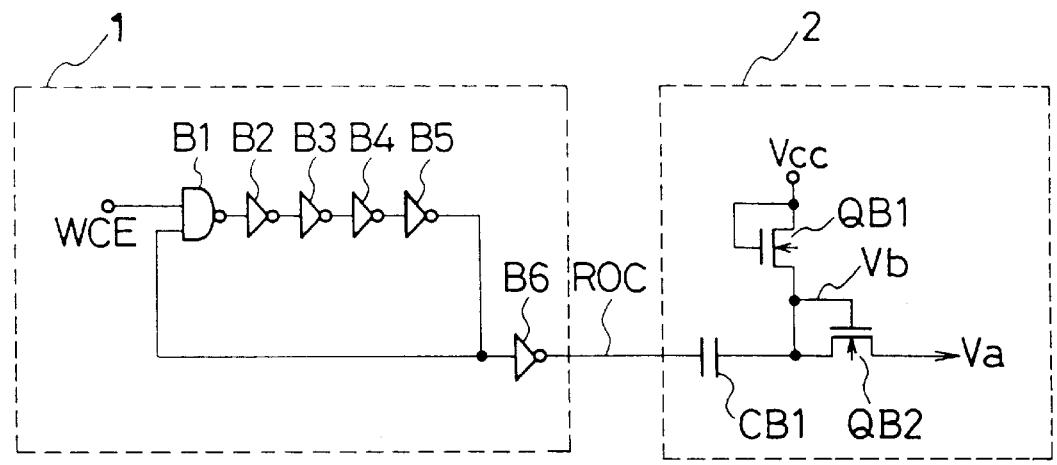
FIG. 7 is a block diagram that shows a voltage boosting circuit that uses a charge pump according to the prior art.

Next, when the write start signal WCE for the writing of data into the memory cells 3 changes to the high level, the ring oscillator operates according to the combination of the NAND circuit 11 and the four inverters 10a, 10b, 10c, and 10d, the ring oscillator output signal ROC operating as shown in FIG. 6(a), with a period that is established by the NAND circuit 11 and the four inverters 10a, 10b, 10c, and 10d.

The voltage boosting circuit 2 inputs the ring oscillator output signal ROC from the ring oscillator 1, and raises the potential on the word line of the memory cells 3.

When the raised potential Va according to the voltage boosting circuit 2, as shown in FIG. 6(a), rises when the ring oscillator output signal ROC changes to the high level.

At the input C of the counter 9, as shown by the broken line 9a in FIG. 6(a), a signal is input which has the same period as the ring oscillator output signal ROC but has a phase shift that is established by the four inverters 10e, 10f, 10g, and 10h and, when the input C to the counter 9 changes to the low level on the second voltage boosting operation (at the time X), the output Q of the counter 9, as shown in FIG. 4, changes to the high level.

By doing the above, the connection is switched from transistors Q1 and Q2 to transistors Q3 and Q4, as shown in FIG. 2 and, from this point, the ring oscillator period changes to the period T2, which is established by the logic operating speed of the combination of the eight inverters 10a, 10b, 10c, 10d, 10e, 10f, 10g, and 10h, and the NAND circuit 11.

Therefore, according to a semiconductor memory device of the first embodiment of the present invention, after the boosted potential Vbb is reached, it is possible to reduce the AC current flowing in the ring oscillator.

The reason for this is that, when the ring oscillator period is fixed, the charging/discharging current of the eight inverters 10a, 10b, 10c, 10d, 10e, 10f, 10g, and 10h and the NAND circuit 11 flows and, if the period becomes long, the steady state current, which is the average current value, becomes small. For this reason, it is possible to operate an SRAM semiconductor memory device for a long period of time using battery power.

In the first embodiment of the present invention, there are two voltage boosting operations before reaching the boosted potential VBB and, when the counter 9 input C changes to the low level on the second boosting operation, the output Q of the counter 9 operates.

In the case in which it is not possible to reach the raised potential VBB on the two voltage boosting operations, the number of times the counter 9 operates can be changed, and it is possible to provide a number of logic circuits 9a, such as shown in FIG. 4, enabling implementation of an arbitrary number n of voltage boosting operations.

Figure 3:
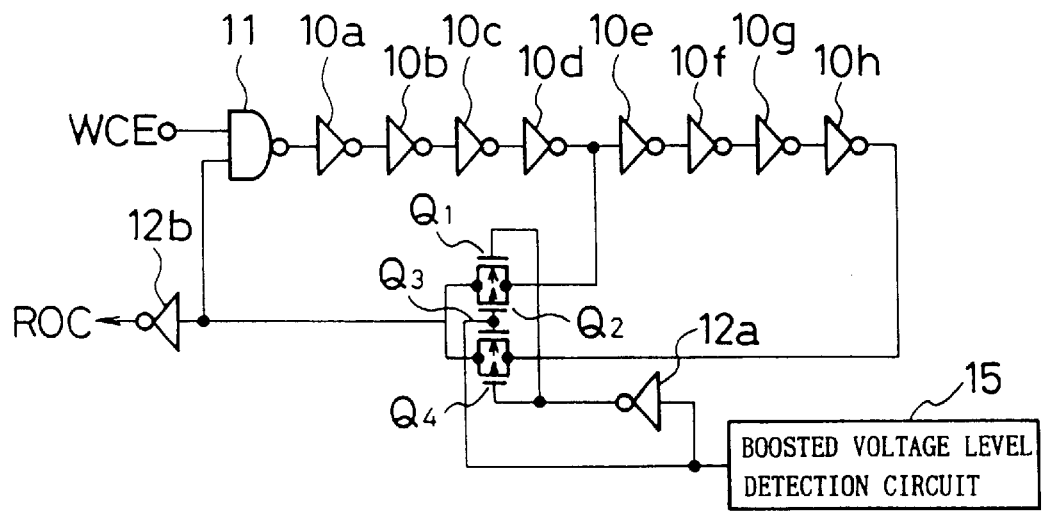
FIG. 3 is a block diagram that shows a ring oscillator that is used in a semiconductor memory device according to the second embodiment of the present invention.

The second embodiment of a semiconductor memory device according to the present invention is shown in the block diagram of FIG. 3.

As shown in FIG. 3, in the second embodiment of a semiconductor memory device according to the present invention, the period of the ring oscillator 1 which is connected to the boosting circuit 2, is switched by detecting the achievement of a potential VBB that is required for the writing of data into memory cells at a low voltage, using the boosted voltage level detection circuit 15.

Until the time at which the voltage boosting circuit output potential Va reaches the boosted potential VBB, the ring oscillator period is made fast, after which the ring oscillator period is made slow.

Figure 5:
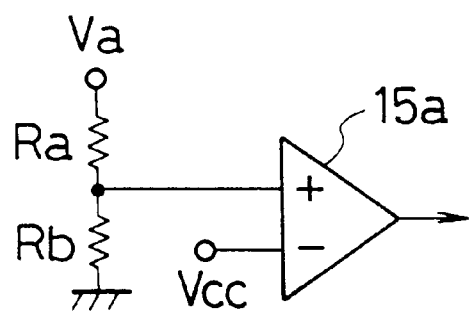
FIG. 5 is a block diagram that shows a raised voltage level detection circuit that is used in a semiconductor memory device according to the second embodiment of the present invention.

FIG. 5 is a block diagram that shows a boosted voltage level detection circuit 15 that is used in FIG. 3.

As shown in FIG. 5, the boosted voltage level detection circuit 15 accepts inputs that are the boosted potential Va and the external power supply potential VCC, and is formed by a differential amplifier 15a and resistances Ra and Rb.

The resistance values of the resistances Ra and Rb used in the above level detection circuit 15 can be established by the formula given below, and if the external power supply potential is VCC and the boosted potential is VBB, the ratio of the resistances Ra and Rb can be determined.

$$VCC=(Rb/(Ra+Rb))\times VBB \quad\quad\quad \text{(Equation 4)}$$

The operation of the boosted voltage level detection circuit 15 shown in FIG. 5 is described below, with reference being made to FIG. 6(b).

In the case in which the memory cell data write start signal WCE as shown in FIG. 6(a) is at the low level, because the boosted potential Va is below the external power supply potential VCC, the external power supply potential VCC, which is the inverting input of the differential amplifier 15a is the higher of the inputs, the result being that the output Q is at the low level.

Next, when the memory cell data write start signal WCE change to the high level, similar to the case of the ring oscillator 1 that is shown in FIG. 3, the ring oscillator operates at a logical period determined in accordance with the combination of the NAND gate circuit 11 and the four inverters 10a, 10b, 10c, and 10d that are shown in FIG. 2, the ring oscillator output signal ROC operating as shown in FIG. 6(b), with a period that is established by the NAND circuit 11 and the four inverters 10a, 10b, 10c, and 10d, so as to perform a voltage boosting operation on the boosted potential Va, as shown in FIG. 6(b).

The operation of the second embodiment of the present invention as shown in FIG. 6(b) is for the case in which there are four voltage boosting operations and, at time Y, at which the boosted potential Va exceeds VBB, of the inputs to the boosted voltage level detection circuit 15 shown in FIG. 5, the non-inverting input at the connection between the resistances Ra and Rb is higher than the external power supply potential VCC, the result being that the output Q of the raised voltage level detection circuit 15 changes to the high level.

Therefore, as shown in FIG. 2, connection is switched from the transistors Q1 and Q2 to transistors Q3 and Q4 shown in FIG. 3, and from this point in time the period of the ring oscillator is changed to a period that is established by the logic operating speed of the eight inverters 10a, 10b, 10c, 10d, 10e, 10f, 10g, and 10h and the NAND circuit 11.

Therefore, according to the second embodiment of a semiconductor memory device according to the present invention, similar to the case of the first embodiment, it is possible to reduce the AC current flowing in the ring oscillator after raising the voltage to the raised voltage Vbb.

As explained above. the static semiconductor memory device of the present invention basically has the technical conception in that the device comprising memory cells, word lines each being connected to the memory cells and a word line boosting circuit including a ring oscillator therein and which is connected to the word line, the static semiconductor memory device being driven with a low voltage, wherein the ring oscillator of the boosting circuit is so configured that it is enable to be switched in either one of high frequency driven mode and in low frequency driven mode, in response to an internal command signal.

And in boosting a voltage of the word line of the semiconductor memory device of the present invention, an out put frequency of the ring oscillator is set out at shortened period until the voltage of the word line is boosted upto a predetermined voltage level and after that when the voltage of the word line had reached upto the predetermined voltage level, the out put frequency of the ring oscillator is set out at lengthened periods.

In the static semiconductor memory device of the present invention, the ring oscillator circuit may generate a boosted potential, while the a boosting circuit may boost the voltage of the word line of the memory cell, based on a boosted potential that is output from the ring oscillator.

On the other hand, the internal signal which is used in the present invention can be obtained by a counter means or a word line voltage monitoring means.

Therefore, the semiconductor memory device of the present invention, the ring oscillator circuit can comprise a counter and a transfer gate circuit, wherein the counter can monitor the period of the ring oscillator, and wherein the transfer gate circuit may change the period of the ring oscillator in response to the internal signal generating means.

Moreover, in the semiconductor memory device of the present invention, the transfer gate circuit may count a number of periods that are established by an inverter and a NAND gate circuit and switches the period of the ring oscillator.

Further, in the semiconductor memory device of the present invention, in place of the counter, a raised voltage level detection circuit can be provided, the raised voltage detection circuit inputting the boosted voltage level of the word line through an resister and determining a boosted voltage level thereof by comparing the current voltage of the word line with a reference voltage.

More specifically, in the semiconductor memory device, the ring oscillator may perform a plurality of voltage boosting operations until the word line boosted potential reaches a voltage level that is required for memory cell writing, the ring oscillator boosting the word line potential with a shortened ring oscillator output period until the plurality of voltage boosting operations are performed, so as to boost the voltage level of the word line rapidly, and operating with a lengthened ring oscillator output period after the achievement of the raised voltage level.

In a method for operating a static semiconductor memory device which is driven with a low voltage, and comprising memory cells, word lines each being connected to the memory cells and a word line boosting circuit including a ring oscillator therein and which is connected to the word line, the method comprising the step of switching the ring oscillator of the boosting circuit so as to be in either one of high frequency driven mode and in low frequency driven mode, in response to an internal command signal.

Further in a method for operating a static semiconductor memory device of the present invention, in boosting a voltage of the word line, an out put frequency of the ring oscillator is set out at shortened period until the voltage of the word line is boosted upto a predetermined voltage level and after that when the voltage of the word line had reached upto the predetermined voltage level, the out put frequency of the ring oscillator is switched to be set out at lengthened periods.

According to the present invention as described in detail above, a static type semiconductor memory device which can be driven with a low voltage level in which a rapid data writing and reading operations can be implemented utilizing an internal operation command, can be provided and further it is possible to perform operation for a long period of time powered by a low-voltage battery.

Additionally, even if the raised voltage is achieved by a plurality of voltage boosting operations, because, in contrast to the prior art, it is not necessary to provide a plurality of logic circuits, it is possible to achieve a circuit arrangement that uses a small amount of surface area.

What is claimed is:

1. A static semiconductor memory device comprising memory cells, word lines each being connected to said memory cells and a word line boosting circuit including a ring oscillator therein and which is connected to said word line, said static semiconductor memory device being driven with a low voltage, wherein said ring oscillator of said boosting circuit is operative to be switched in either one of high frequency driven mode to boost a voltage of said word line and in low frequency driven mode to maintain said boosted voltage of said word line, in response to a command signal.

2. A static semiconductor memory device according to claim 1, wherein, in boosting a voltage of said word line, an output frequency of said ring oscillator is set at a shortened period until said voltage of said word line is boosted upto a predetermined voltage level and when said voltage of said word line had reached said predetermined voltage level, said output frequency of said ring oscillator is set at lengthened periods.

3. A static semiconductor memory device according to claim 1, wherein, said ring oscillator generates a boosted potential, while said a boosting circuit boosts said voltage of said word line of said memory cell, based on a boosted potential that is output from said ring oscillator.

4. A semiconductor memory device according to claim 1, wherein said ring oscillator performs a plurality of voltage boosting operations until the word line boosted potential reaches a voltage level that is required for memory cell writing, said ring oscillator boosting the word line potential with a shortened ring oscillator output period until said plurality of voltage boosting operations are performed, so as to boost said voltage level of said word line rapidly, and operating with a lengthened ring oscillator output period after the achievement of the raised voltage level.

5. A semiconductor memory device driven with a low voltage, comprising a memory cell, a row decoder, a column decoder, a bit line control circuit, a voltage boosting circuit, and a ring oscillator, wherein said memory cell is caused to a store data, said row decoder selects a word line of said memory cell from an address buffer input, said column decoder selects a bit line of said memory cell, said bit line control circuit performs writing of data to and reading of data from said memory cell, and said voltage boosting circuit causes a potential of said word line of said memory cell to rise, and further wherein said ring oscillator generates a boosted potential for the purpose of raising the potential of said memory cell word line, said ring oscillator operating with a shortened period until reaching said raised voltage and operating with a lengthened period after reaching said raised voltage, in response to a command signal output from a signal generating means.

6. A semiconductor memory device according to claim 5, wherein said command signal is provided by a counter means or a word line voltage monitoring means.

7. A semiconductor memory device according to claim 5, wherein said ring oscillator comprises a counter and a transfer gate circuit, wherein said counter monitors the period of said ring oscillator, and wherein said transfer gate circuit changes the period of said ring oscillator in response to said signal generating means.

8. A semiconductor memory device according to claim 7, wherein said transfer gate circuit counts a number of periods that are established by an inverter and a NAND gate circuit and switches the period of said ring oscillator.

9. A semiconductor memory device according to claim 8, wherein, in place of said counter, a raised voltage level detection circuit is provided, said raised voltage detection circuit inputting said boosted voltage level of said word line through a resistor and determining a boosted voltage level thereof by comparing said current voltage of said word line with a reference voltage.

10. A method for operating a static semiconductor memory device which is driven with a low voltage, and comprising memory cells, word lines each being connected to said memory cells and a word line boosting circuit including a ring oscillator therein and which is connected to said word line, said method comprising:

switching said ring oscillator of said boosting circuit to be in either one of high frequency driven mode to boost a voltage of said word lines and low frequency driven mode to maintain said boosted voltage of said word lines, in response to an internal command signal.

11. A method for operating a static semiconductor memory device according to claim 10, further comprising, operating said ring oscillator at a shortened period to boost said voltage of said word lines until said voltage of said word lines reach a predetermined voltage level and when said voltage of said word lines have reached said predetermined voltage level, switching said ring oscillator to be set at lengthened periods.

12. A method for operating a static semiconductor memory device according to claim 10, wherein, said ring oscillator generates a boosted potential, while said word line boosting circuit boosts said voltage of said word lines of said memory cells, based on the boosted potential that is output from said ring oscillator.

* * * * *